United States Patent
Kallmann et al.

(10) Patent No.: US 7,075,957 B2
(45) Date of Patent: Jul. 11, 2006

(54) CONTROLLING AN OPTICAL SOURCE USING A BEAT FREQUENCY

(75) Inventors: Ulrich Kallmann, Tübingen (DE);
Bernd Nebendahl, Ditzingen (DE);
Wolf Steffens, Herrenberg (DE);
Emmerich Mueller, Aidlingen (DE);
Hansjoerg Haisch, Altdorf (DE);
Jochen Schwarz, Stuttgart (DE)

(73) Assignee: Agilent Technologies, Inc., Palo Alto, CA (US)

(*) Notice: Subject to any disclaimer, the term of this patent is extended or adjusted under 35 U.S.C. 154(b) by 288 days.

(21) Appl. No.: 10/713,313

(22) Filed: Nov. 14, 2003

(65) Prior Publication Data

US 2004/0136413 A1 Jul. 15, 2004

(30) Foreign Application Priority Data

Dec. 5, 2002 (EP) .................................. 02102686

(51) Int. Cl.
*H01S 3/13* (2006.01)
*H03L 7/00* (2006.01)
*H03B 21/00* (2006.01)

(52) U.S. Cl. .......................... 372/32; 331/18; 331/40; 331/41

(58) Field of Classification Search ............ 372/18–20, 372/28, 32; 331/1 R, 18, 34, 37, 38, 40–42
See application file for complete search history.

(56) References Cited

U.S. PATENT DOCUMENTS

| | | | | |
|---|---|---|---|---|
| 3,946,329 A | * | 3/1976 | Caspari | 331/4 |
| 4,347,483 A | * | 8/1982 | Flasza et al. | 331/12 |
| 4,468,773 A | * | 8/1984 | Seaton | 372/32 |
| 4,782,385 A | * | 11/1988 | Gunter et al. | 348/728 |
| 4,965,805 A | * | 10/1990 | Hayes | 372/32 |
| 5,153,888 A | * | 10/1992 | Imamura et al. | 372/32 |
| 6,115,162 A | | 9/2000 | Graves et al. | 359/173 |
| 6,122,087 A | | 9/2000 | Nogiwa et al. | 359/187 |

FOREIGN PATENT DOCUMENTS

| | | |
|---|---|---|
| EP | 1 075 063 A2 * | 2/2001 |
| EP | 1075063 A2 | 2/2001 |
| WO | WO 02/060016 | 8/2002 |

OTHER PUBLICATIONS

"Wide-Span Optical Frequency Comb Generator For Accurate Optical Frequency Difference Measurement", Motonobu Kourogi et al., IEEE Journal of Quantum Electronics, Vo. 29, No. 10, pp. 2693-2699, Oct. 29, 1993.

* cited by examiner

*Primary Examiner*—Don Wong
*Assistant Examiner*—Leith Al-Nazer

(57) ABSTRACT

An apparatus and method of controlling an optical signal includes superimposing at least one optical reference signal and the optical signal to obtain at least one interference signal having an actual beat frequency, and pre-selecting one or more of the at least one interference signals using a predetermined bandwidth and a filter characteristic that is asymmetric with respect to an actual frequency of the optical signal, to determine a position of the optical signal relative to the at least one optical reference signal.

23 Claims, 3 Drawing Sheets

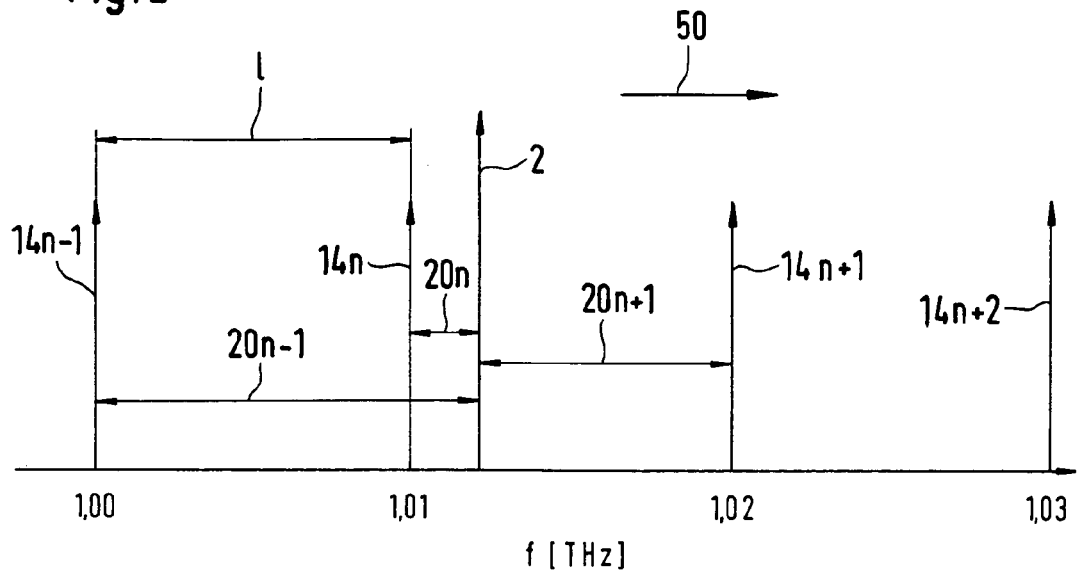
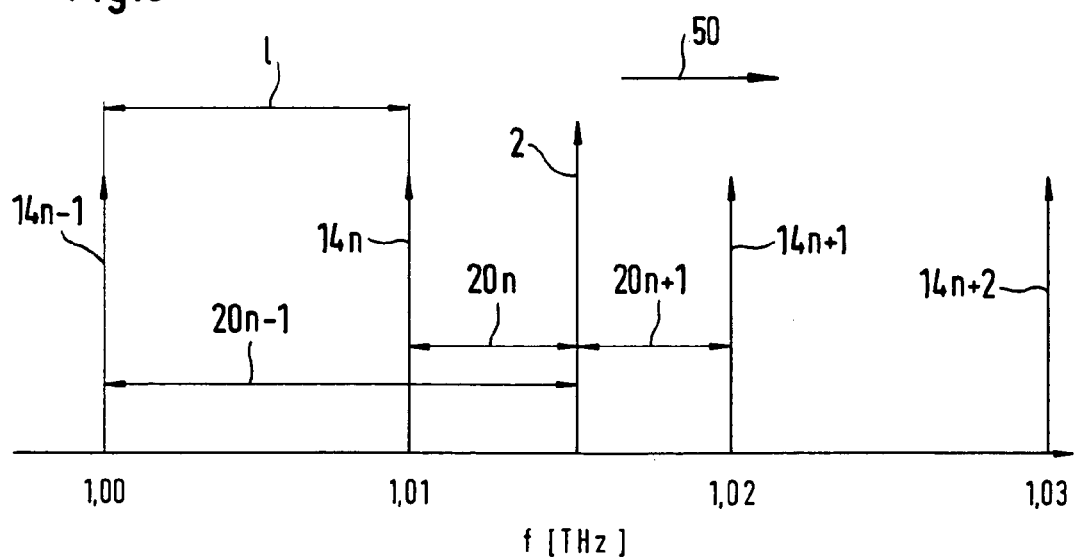

CONTROLLING AN OPTICAL SOURCE USING A BEAT FREQUENCY

BACKGROUND OF THE INVENTION

1. Field of the Invention

The present invention relates to controlling an optical signal.

2. Brief Description of Related Developments

Tunable laser sources (TLS) for providing a tunable laser signal are known in the art and disclosed e.g. in A. C. Bordinalli, et.al., "High-Performance Phase Locking of Wide Linewidth Semiconductor Lasers by Combined Use of Optical Injection Locking and Optical Phase-Lock Loop", Journal of Lightwave Technology, Vol. 17, No. 2, 1999, pp. 328–342, B. Cai, et.al., "Microwave frequency synthesis using injection locked laser comb line selection", Proc. LEOS Summer Topical Meetings, Keystone, 1995, Digest No. $95^{TH}8031$, Paper WD2, pp. 13–14, H. Takesue, et.al., "Stable Lightwave Frequency Synthesis Over 1-THz Span Using Fabry-Perot Cavity Containing Polarization-Rotation Elements and Actively Controlled Tunable Bandpass Filter", IEEE Photonics Technology Letters, Vol. 12, No. 1, 2000, pp. 79–81, Hashimoto et. Al. "Synchronization of subterahertz optical pulse train from PLL-controller colliding pulse modelocked semiconductor laser", Electronics Letters, Vo. 34, No. 6, 1998, pp. 580–581, John D. Jost et al., "Continuously tunable, precise, single frequency optical signal generator", Optics Express, Vol. 10, No. 12, 2002, pp. 515–519, Katagiri et.al., "Synchronized pulse-train generation from passively modelocked semiconductor lasers by a phase-locked loop using optical modulation sidebands", Electronics Letters, Vol. 32, No. 20, 1996, pp. 1892–1894, S.-L. Tsao, et.al., "Phaselocked tunable subcarrier comb generator", Electronics Letters, Vol. 30, No. 24, 1994, pp. 2059–2060, O. Ishida, "Laser Frequency Synthesis Employing Fibre Four-Wave Mixing", IEEE Photonics Technologies Letters, Vol. 4, No. 10, 1992, pp. 1171–1173. The disclosure of the aforementioned documents is incorporated herein by reference.

SUMMARY OF THE INVENTION

It is an object of the invention to provide an improved controlling of an optical signal. The object is solved by the independent claims. Preferred embodiments are shown by the dependent claims.

For many applications in the field of optical communication and measurement using optical sources it is desirable to have an optical source generating an optical signal having high frequency precision, e.g. to control an optical signal with a relative precision in the kHz frequency range. An embodiment of the present invention provides such a source. The inventive source and the inventive method can be used for TLSs having ultra-high tuning linearity, for heterodyne analysis of optical spectra and networks, or as an optical frequency normal.

In an embodiment frequency precision of the control of an optical signal is achieved through frequency discrimination in the electrical frequency domain.

An embodiment of the present invention comprises a comb generator providing a comb of optical reference signals e.g. controlled by an electrical master clock signal. Preferably, the frequency distance between each adjacent optical reference signal of the comb is determined by mode-locking the optical reference signals to the master clock signal. The frequency distance can be about 10 GHz for example. An advantage of such a reference comb is the possibility of covering a wide range of frequencies, e.g. a range of 100 THz or more, so that at least one of the teeth of the comb is within the bandwidth of the detector, e.g. a photodiode, and also near the frequency of the optical signal.

Additionally, a phase locked loop can be used locking the comb to an optical frequency reference by locking at least one of the optical reference signals of the comb to the optical frequency reference. The optical frequency reference can be at least one of the following: an absolute optical frequency reference, a gas cell for absorbing one or more of the optical reference signals of the comb, an ultra stable laser source.

With the help of the comb a frequency of the absolute optical frequency reference can be chosen which is e.g. 100 THz or more away from the actual frequency of the optical signal although due to the huge extension of the comb still at least one signal line of the comb is in vicinity of the actual frequency of the optical signal so that it can interfere with the optical signal, thus generating a beat signal e.g. on the detector.

According to a preferred embodiment, a preselector or filter is provided for preselecting the optical signal line(s) of the comb and the optical signal before the optical signals interfere (e.g. at the detector) and generate corresponding beat signal(s). The preselector, e.g. a self-adjustable tunable filter, can advantageously avoid a saturation of the detector. The filter can preferably be controlled in a way to follow the frequency position of the optical signal so that the actual frequency of the optical signal is always within the filter. Such a filter following an optical signal is for example disclosed in European patent application EP-A-1253687 of the applicant, the teaching of which shall be incorporated herein by reference.

Preferably, the predetermined bandwidth provided by the preselector comprises the actual frequency of the optical signal and one or more, and preferably at least two, optical reference signals of the comb. This allows choosing the section of the comb in which the actual frequency of the optical signal is expected. The filter characteristic of the preselector can be symmetric or asymmetric with respect to the actual frequency of the optical signal.

Additionally or alternatively the invention can comprise an optical frequency-measuring unit separately (pre-)determining the actual frequency of the optical signal. By this measurement it is also provided an independent indication in which wavelength area of the comb the superposition between the tooth/teeth of the comb and the optical signal occurs.

The bandwidth of the preselector preferably covers the predetermined actual frequency of the optical signal, and the filter characteristic of the preselector is preferably selected to be asymmetric with respect to the actual frequency of the optical signal. By this embodiment it is possible to determine the tuning direction when tuning the frequency of the optical signal or to determine, whether a detected beat signal results from the interference between the actual optical signal and an optical reference signal, which possesses a higher or lower optical frequency. This is due to the fact that the amplitudes of different optical reference signals experience different attenuations according to their position relative to the actual optical signal and due to the asymmetric filter characteristic. Those different amplitudes together with the actual optical signal generate beat signals of different intensity heights at the detector. Therefore the height of the beat signal indicates the relative position of the optical reference signal with respect to the actual optical signal.

Preferably, the detector bandwidth is chosen in a way that the detector can detect at least three actual beat signals (e.g. at least 3/2 Fm) created by superimposing the at least three optical reference signals with the optical signal. This enables the determination of a deviation of the frequency of the optical signal with respect to a target frequency of the optical signal and the determination of the sign of the deviation. It is an advantage of this embodiment that it enables the determination of the tuning direction when tuning the optical signal.

In a preferred embodiment of the invention, at least one electrical oscillator provides at least two (and preferably three) target beat frequencies by providing at least two (and preferably three) electrical oscillator signals. This enables the evaluation unit evaluating the sign of the deviation value on the basis of the detected actual beat frequencies by comparing the at least two (and preferably three) actual beat frequencies with the at least two (and preferably three) electrical oscillator signals. While two target beat frequencies are sufficient for direction detection, ambiguities may arise from a position of the optical signal precisely between two teeth of the reference comb. Here when tuning the optical signal the beat signals will cross their paths as one moves in the increasing and the other one in the decreasing frequency directions. The presence of both beat signals in this beat frequency range around FM/2 can be difficult to processes. However, such 'dead zone' can be avoided using a third target beat frequency allowing an improved control of the tuning direction when tuning the useful optical signal.

Furthermore, at least one mixer can be used for mixing the at least two actual beat signals with the at least two electrical oscillator signals to enable the evaluation unit evaluating the sign of the deviation value on the basis of the detected beat signals by means of the at least one mixer mixing the at least two actual beat signals with the at least two electrical oscillator signals.

The at least one electrical oscillator can preferably be designed to determine the target beat frequencies according to the following scheme:

PFk=|F0−FN|, and PFk being the target beat frequency of the kth electrical oscillator signal, k being 1, 2, 3, . . . , F0 being the target frequency of the optical signal, FN=Fref+N*Fm, FN being the Nth optical signal line of the reference comb away from the absolute optical reference line Fref, Fm being the frequency of the electrical master clock signal and Fref being the frequency of the absolute optical frequency reference.

The at least one mixer can preferably be designed to provide an error signal for at least two of the actual beat frequencies and feeding at least two of the error signals into a respective loop filter connected to the at least one mixer, advantageously connected to a combining unit combining the loop filtered error signals with a positive or negative sign according to the following scheme (for the example of three beat frequencies):

For three loop filtered signals the sign of each error signal changes every 3/2 Fm, for the at least three target beat frequencies of the at least three electrical oscillator signals PFk a sign change of the error signals occurs every 0.5 Fm, and for one of the error signals every 0.5 Fm the sign changes, whereby the sign change is recursive every 3 Fm, and Fm being the frequency of the electrical master clock signal, PFk being the target beat frequency of the kth electrical oscillator signal, k being 1, 2, 3, . . . This control scheme ensures that no jumps in the frequency of the electrical oscillator signals are needed when tuning the optical signal.

Tuning the optical signal to the target frequency can work as follows for the example of three beat frequencies):

Every frequency band between two consecutive signal lines of the reference comb is divided in 2 sub-bands. Before tuning the target sub-band is determined from Msb=(F0−Fref)/(0.5 Fm)+1. Starting from Fref the optical signal target frequency is increased by increasing 2 of electrical oscillator signals and decreasing one. Thus the optical signal frequency follows until the next sub-band edge is reached. Then for one of the error signals the sign changes and in the next sub-band the corresponding electrical oscillator changes its tuning direction, while the other 2 electrical oscillators keep the tuning direction.

This scheme is followed across Msb-1 sub-bands until the target sub-band is reached.

In another preferred embodiment, the control of the actual frequency of the optical signal comprises: filtering at least two, preferably three, actual beat frequencies within a predetermined bandwidth, the predetermined bandwidth comprising the actual frequency of the optical signal, detecting at least two, preferably at least three, actual beat frequencies of a superposition of the optical reference signals of the comb with the optical signal, evaluating a deviation value by comparing the detected actual beat frequencies with the target beat frequencies to detect a mismatch if any between the target beat frequencies and the actual beat frequencies. Filtering can be done e.g. by the aforedescribed optical preselector.

It is preferred that characteristic of the filter or optical preselector is asymmetric over the wavelength and with respect to the actual frequency of the optical signal. Therefore, it is possible to detect an intensity difference, if any, between the signals of the actual beat frequencies and to evaluate a tuning direction of the optical signal when tuning the optical signal and/or to detect a sign of the mismatch, if any. According to this embodiment it is therefore possible to determine a tuning direction and/or a sign of a mismatch between a desired target beat frequency which mirrors a desired target frequency of the optical signal and an actual beat frequency which mirrors an actual frequency of the optical signal.

By choosing such asymmetric filter or optical preselector and/or locking the tunable source frequency via electrical oscillators according to the aforementioned scheme it is therefore possible to control (and preferably even unambiguously) the frequencies of the laser source e.g. even in the kHz frequency range.

A quartz oscillator can be used to provide the electrical master clock signal.

The optical source can be a tunable laser source to tune the optical signal.

The invention can be partly embodied or supported by one or more suitable software programs, which can be stored on or otherwise provided by any kind of data carrier, and which might be executed in or by any suitable data processing unit. Software programs or routines are preferably applied to the realization of the inventive method.

BRIEF DESCRIPTION OF THE DRAWINGS

Other objects and many of the attendant advantages of the present invention will be readily appreciated and become better understood by reference to the following detailed description when considering in connection with the accompanied drawings. The components in the drawings are not necessarily to scale, emphasis instead being placed upon clearly illustrating the principles of the present invention. Features that are substantially or functionally equal or similar will be referred to with the same reference sign(s).

FIG. 2 shows a graph illustrating the function of an embodiment;

FIG. 3 shows an optical signal positioned between two teeth of the comb of optical reference signals;

DETAILED DESCRIPTION OF THE PREFERRED EMBODIMENT(S)

Figure 1:
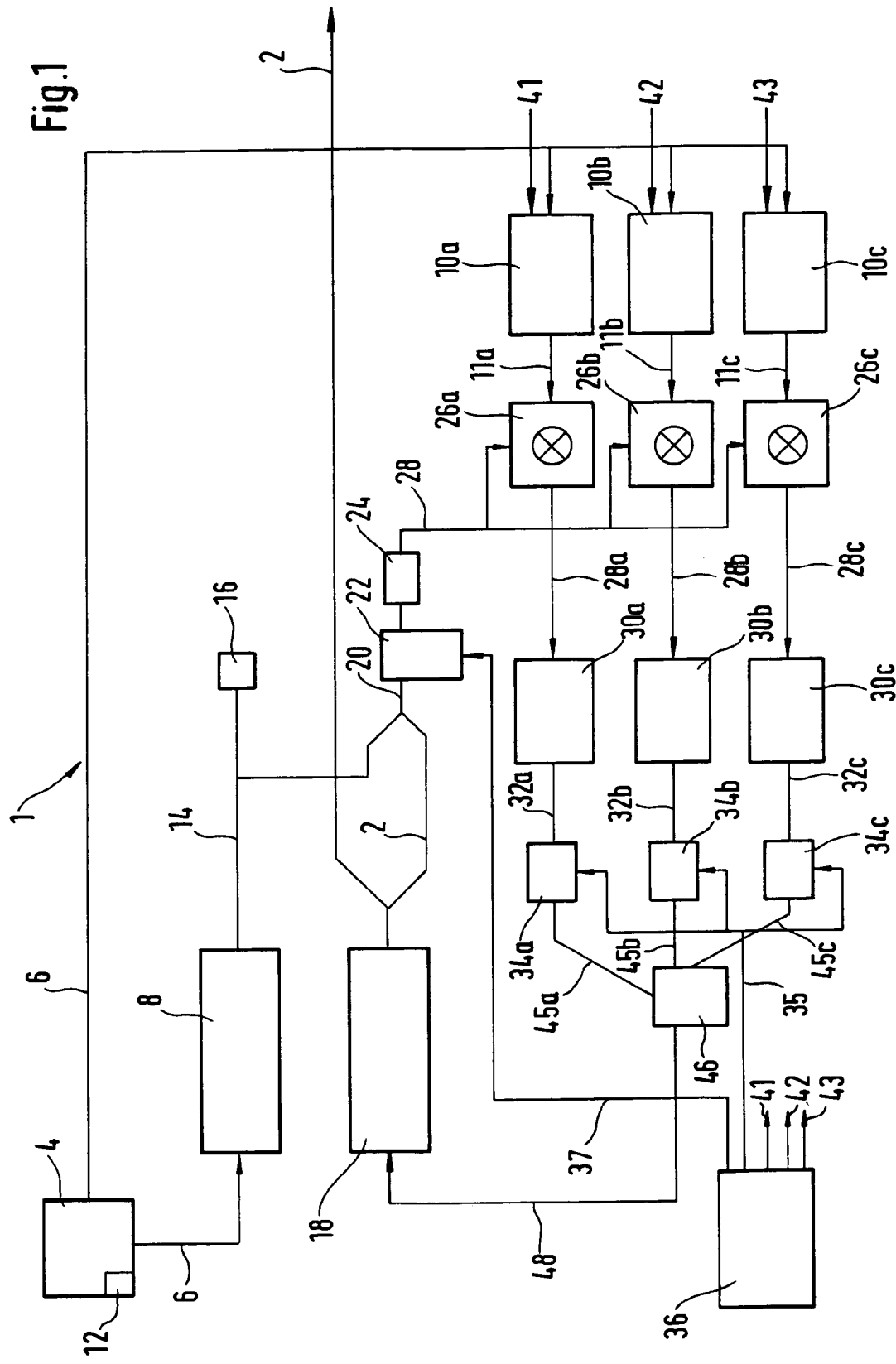
FIG. 1 shows a schematic illustration of an apparatus for providing an optical signal.

Referring now in greater detail to the drawings, FIG. 1 shows a schematic illustration of an apparatus 1 for providing an optical signal 2 according to an embodiment of the present invention. Apparatus 1 comprises a master clock 4 for providing an electrical master clock signal 6 to an optical reference source 8 and to three electrical oscillators 10a, 10b and 10c. The master clock 4 comprises a quartz oscillator 12 for generating the electrical master clock signal 6.

Optical reference source 8 is mode-locked to the master clock 4 thereby providing a comb generator to provide a comb of optical reference signals 14 controlled by the electrical master clock signal 6. The frequency distance of about e.g. 10 GHz between each adjacent optical reference signal of the comb 14 is determined by the mode-locking of the optical reference source 8 to the master clock signal 6.

Apparatus 1 further comprises a gas cell 16 for absorbing one of the optical reference signals 14 of the comb to provide an absolute optical frequency reference. A phase locked loop is locking the comb 14 to the absolute optical frequency reference 16 by locking one of the optical reference signals 14 of the comb to the absolute optical frequency reference 16.

Apparatus 1 further comprises as an optical source a TLS 18 providing the optical signal 2 with a target frequency and having an actual frequency.

The comb of optical reference signals 14 and the optical signal 2 are superimposed to create at least one interference signal 20 having an actual beat frequency. The signal 20 is provided to an optical pre-selector 22 for pre-selecting the at least one interference signal 20 with a predetermined bandwidth before the at least one interference signal 20 reaches a detector 24. The detector 24 generates an electrical beat signal 28 from the interference signal 20. The detector 24 has a detection bandwidth of e.g. about 16 GHz for the e.g. 10 GHz frequency of the master clock signal 6. The detection bandwidth of detector 24 is chosen to provide that actual beat frequencies of beat signals 20 with at least three optical reference signals 14 are within the detection bandwidth. The predetermined bandwidth of the pre-selector 22 is chosen to provide that interference signals of at least three optical reference signals 14 and the optical signal 2 are within the predetermined bandwidth of the pre-selector 22. Moreover, the filter characteristic of pre-selector 22 comprises the actual frequency of the optical signal 2 and is asymmetric with respect to the actual frequency of the optical signal 2.

Apparatus 1 further comprises three mixers 26a, 26b and 26c mixing a signal 28 of the detector 24 with signals 11a, 11b and 11c of electrical oscillators 10a, 10b and 10c, respectively. Mixers 26a, 26b and 26c generate error signals 28a, 28b, 28c which are provided to respective loop filters 30a, 30b, 30c. The loop filtered signals 32a, 32b, 32c are provided to combination units 34a, 34b, 34c which combine the loop filtered error signals 32a, 32b, 32c with a positive or negative sign according to the following scheme:

for three loop filtered signals 32a, 32b, 32c the sign of each error signal 28a, 28b, 28c changes every 3/2 Fm, for the at least three target beat frequencies of the at least three electrical oscillator signals 11a, 11b, 11c PFk a sign change of the error signals 28a, 28b, 28c occurs every 0.5 Fm, and for one of the error signals 28a, 28b, 28c every 0.5 Fm the sign changes, whereby the sign change is recursive every 3 Fm, and Fm being the frequency of the electrical master clock signal 6, PFk being the target beat frequency of the kth electrical oscillator signal 11a, 11b, 11c, k being 1, 2, 3, . . . .

The combining units 34a, 34b, 34c are controlled by a control signal 35 which is provided by a control unit 36. Control unit 36 also controls pre-selector 22 via a control signal 37 and electrical oscillators 10a, 10b and 10c via control signals 41, 42, 43 by the following scheme:

PFk=|F0−FN|, and

PFk being the target beat frequency of the kth electrical oscillator signal 11a, 11b, 11c, k being 1, 2, 3, . . . , F0 being the target frequency of the optical signal 2, FN=Fref+N*Fm, FN being the Nth optical signal line of the reference comb away from the absolute optical reference line Fref, Fm being the frequency of the electrical master clock signal 6 and Fref being the frequency of the absolute optical frequency reference 16.

Combining units 34a, 34b and 34c are providing their outputs 45a, 45b, 45c to an evaluation and correction unit 46. The evaluation and correction unit 46 evaluates a deviation value on the basis of the outputs 45a, 45b, 45c, which deviation value indicates a mismatch between the target frequency of optical signal 2 and the actual frequency of optical signal 2. Evaluation and correction unit 46 then provides a correction signal 48 to TLS 18 to enable the correction of the actual frequency to the target frequency by using the deviation value, when the deviation value is indicating a mismatch between the target frequency and the actual frequency of the optical signal 2.

The aforementioned schemes for providing the electrical oscillator signals 11a, 11b and 11c and for providing the signs to the error signals 28a, 28b and 28c by the combining units 34a, 34b and 34c and the asymmetric position of the pre-selecting filter 22 with respect to the actual frequency of the optical signal 2 enables apparatus 1 to tune optical signal 2 by TLS 18 in a continuous way without the need of frequency jumps in the electrical oscillator signals 11a, 11b and 11c and concurrently ensuring a relative precision in the kHz frequency range of the actual frequency of the optical signal 2 with respect to the frequency of the optical signal 2 when tuning the optical signal 2 by TLS 18.

FIG. 2 shows a graph schematically illustrating the function of an embodiment of the present invention. In FIG. 2 teeth 14n−1, 14n, 14n+1 and 14n+2 of a comb of optical reference signals 14 are depicted by respective arrows on a frequency scale f from 1.00 THz to 1.03 THz. The distance between two of the teeth 14n−1, 14n, 14n+1, 14n+2 is I=10 GHz. Furthermore, the actual frequency of an optical signal 2 is indicated.

Then detecting the optical signal 2 the superposition of the optical signal 2 with the optical reference signal 14n−1, 14n, 14n+1 creates actual beat signals having actual beat frequencies indicated by double arrows 20 n−1, 20n and 20n+1. These actual beat frequencies 20n−1, 20n and 20n+1 can be compared with target beat frequencies 11a, 11b, 11c as described with respect to the embodiment of FIG. 1. Therefore, a mismatch between the actual beat frequencies 20n−1, 20n, 20n+1 and the target beat frequencies 11a, 11b, 11c can be detected, if any, and can be corrected by the correction mechanism as described with respect to FIG. 1.

Additionally, it is possible according to the embodiment of FIG. 2 to detect a tuning direction when tuning the optical signal 2, e.g. by a tunable laser source. This is possible because when tuning the optical signal 2 to higher frequencies as indicated by arrow 50 beat frequency 20n will become greater while beat frequency 20n+1 will become smaller. By this it is clear that optical signal 2 is tuned towards tooth 14n+1 of the comb of optical reference signals 14.

Moreover, it is also possible to detect a tuning direction when tuning the optical signal 2 if the optical signal 2 is positioned in the very middle between two teeth 14n and 14n+1 of the comb of optical reference signals 14 as depicted in FIG. 3. In this situation beat frequencies 20n and 20n+1 have the same value. However, since there is provided the third beat frequency 20n−1 between the optical signal 2 and the reference signal 14n−1 it is still clear that the optical signal 2 is still tuned according to arrow 50 if beat frequency 20n−1 is becoming greater.

Figure 4:
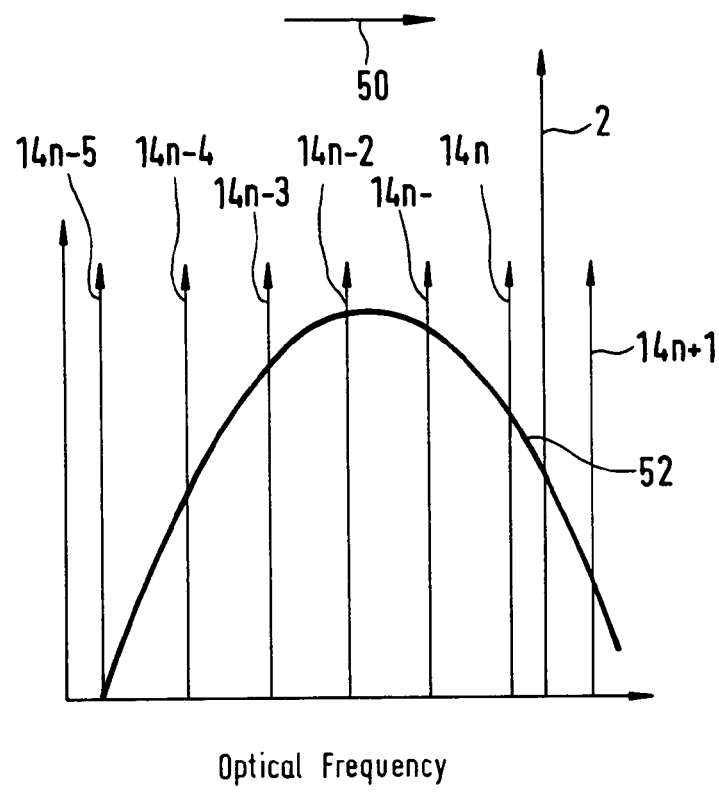
FIG. 4 shows a schematic illustration of another embodiment.

FIG. 4 shows a schematic illustration of another embodiment of the present invention. According to this embodiment an optical pre-selector 52 with a fixed position relative to the optical signal 2 is provided. Again, optical frequency ω is indicated and teeth 14n−5 to 14n+1 are indicated by respective arrows and having respective equally spaced frequencies.

Figure 5:
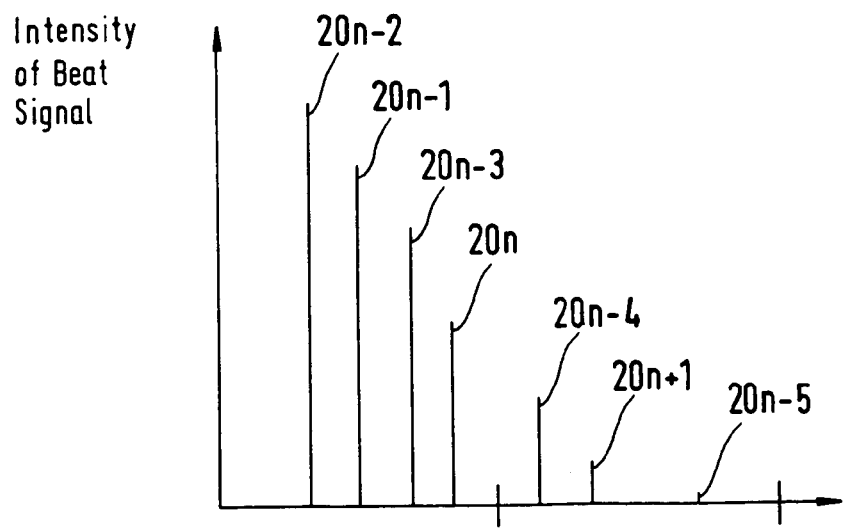
FIG. 5 shows the respective intensities of beat signals with various beat frequencies.

FIG. 5 shows the respective intensities of the beat signals having beat frequencies 20n−5 to 20n+1 created by the superposition of the optical signal 2 with reference signals 14n−5 to 14n+1. As can be seen in FIG. 5 depending on the shape and the bandwidth of optical pre-selector 52 the intensity of the beat signals 20n−5 to 20n+1 is dependent on its frequency position in the frequency spectrum. Therefore, it is possible to determine a tuning direction when tuning the optical signals 2. When for example the optical signal 2 is tuned according to arrow 50 in FIG. 4 the beat signal 20n+1 will gain intensity while the beat signal 20n−4 will lose intensity. Therefore it is clear that optical pre-selector 52 is moving to higher frequencies and therefore optical signal 2 is moving to higher frequencies according to the tuning direction indicated by arrow 50 in FIG. 4.

What is claimed is:

1. A method of controlling an optical signal, comprising:
   superimposing at least one optical reference signal and the optical signal to obtain at least one interference signal having an actual beat frequency, and
   pre-selecting one or more of the at least one interference signals using a predetermined bandwidth and a filter characteristic that is asymmetric with respect to an actual frequency of the optical signal, to determine a position of the optical signal relative to the at least one optical reference signal.

2. The method of claim 1,
   wherein the at least one optical reference signal is provided from a comb of a plurality of optical reference signals, controlled by an electrical master clock signal.

3. The method of claim 2,
   wherein the frequency distance between each adjacent optical reference signal of the comb is determined by mode-locking the plurality of optical reference signals of the comb to the master clock signal.

4. The method of claim 2, further comprising:
   locking the comb to an absolute optical frequency reference by locking at least one of the plurality of optical reference signals of the comb to the absolute optical frequency reference by means of a phase locked loop.

5. The method of claim 4, further comprising the steps of:
   superimposing at least two of the plurality of optical reference signals of the comb with the optical signal to create at least two interference signals having actual beat frequencies,
   evaluating the sign of a deviation value determined by comparing the at least two actual beat frequencies with at least two target beat frequencies provided by at least two electrical oscillator signals by mixing the at least two actual beat frequencies with the at least two electrical oscillator signals.

6. The method of claim 5, further comprising determining the target beat frequencies according to the following scheme:
   PFk=|FO-FN|, and
   PFk being the target beat frequency of the kth electrical oscillator signal 11a, 11b, 11c, k being 1, 2, 3,..., FO being the target frequency of the optical signal 2, FN=Fref+ N*Fm, EN being the Nth optical signal line of the reference comb away from the absolute optical reference line Fref, Fm being the frequency of the electrical master clock signal 6 and Fref being the frequency of the absolute optical frequency reference 16.

7. The method of claim 1, including controlling the actual frequency by at least substantially matching the actual beat frequency with at least one target beat frequency.

8. The method of claim 7,
   wherein the at least one target beat frequency is determined by a superposition of the at least one optical reference signal with a target frequency of the optical signal.

9. The method of claim 1, further comprising:
   adjusting the actual frequency to be in a predetermined frequency range prior to obtaining the at least one interference signal having an actual beat frequency.

10. The method of claim 9,
    wherein the predetermined frequency range covers a frequency of at least one of the at least one optical reference signal.

11. The method of claim 1, further comprising:
    pre-selecting one or more of the at least one interference signals to avoid a saturation of a detector detecting the optical signal.

12. The method of claim 1, further comprising:
    separately predetermining an actual frequency of the optical signal.

13. The method of claim 1, wherein the at least one interference signal includes two or more interference signals, the method further comprising:
    determining the actual beat frequencies of the two or more interference signals,
    evaluating a deviation value by comparing the actual beat frequencies of the two or more interference signals with target beat frequencies, the deviation value indicating a mismatch, if any, between the target beat frequencies and the actual beat frequencies,
    evaluating the sign of the deviation value on the basis of the actual beat frequencies of the two or more interference signals.

14. The method of claim 13, further comprising:
correcting the actual beat frequencies of the two or more interference signals to the target beat frequencies by using the deviation value, when the deviation value indicates a mismatch between the target beat frequencies and the actual beat frequencies.

15. The method of claim 11, wherein the target beat frequencies are provided by at least two electrical oscillator signals.

16. The method of claim 15, further comprising:
comparing the actual beat frequencies of the two or more interference signals with the target beat frequencies by mixing the actual beat frequencies of the two or more interference signals with the at least two electrical oscillator signals.

17. The method of claim 1, wherein the at least one interference signal includes two or more interference signals, the method further comprising:
filtering the actual beat frequencies of the two or more interference signals within a predetermined bandwidth, the predetermined bandwidth covering the actual frequency of the optical signal,
evaluating a deviation value by comparing the filtered actual beat frequencies with target beat frequencies to detect a mismatch, if any, between the target beat frequencies and the filtered actual beat frequencies.

18. The method of claim 17,
further comprising detecting an intensity difference, if any, between the two or more interference signals, to evaluate a tuning direction of the optical signal when tuning the optical signal and/or to evaluate a sign of the mismatch.

19. A method of controlling an optical signal, comprising:
determining at least one actual beat frequency derived from a superposition of at least one optical reference signal with the optical signal, wherein the optical signal has an actual frequency,
using the at least one actual beat frequency in order to control the actual frequency,
providing an error signal for at least three of the actual beat frequencies,
feeding at least three of the error signals into a respective loop filter, and
combining the loop filtered error signals with a positive or negative sign according to the following scheme:
for three loop filtered error signals the sign of each error signal changes every 3/2 Fm,
for the at least three target beat frequencies of the at least three electrical oscillator signals PFk a sign change of the error signals occurs every 0.5 Fm, and
for one of the error signals every 0.5 Fm the sign changes, whereby the sign change is recursive every 3/2 Fm, and
Fm being the frequency of the electrical master clock signal, PFk being the target beat frequency of the kth electrical oscillator signal, k being 1, 2, 3, . . . .

20. A method of providing an optical signal, comprising the steps of:
providing at least one optical reference signal having an actual frequency,
superimposing at least one optical reference signal and the optical signal to obtain at least one interference signal having an actual beat frequency, and
pre-selecting one or more of the at least one interference signals using a predetermined bandwidth and a filter characteristic that is asymmetric with respect to an actual frequency of the optical signal, to determine a position of the optical signal relative to the at least one optical reference signal.

21. A system for controlling an optical signal, comprising:
a signal source for providing the optical signal, wherein the optical signal has an actual frequency,
a reference signal source for providing at least one optical reference signal,
a superimposing unit adapted for superimposing the at least one optical reference signal with the optical signal to yield at least one interference signal having an actual beat frequency,
a preselector adapted for pre-selecting the at least one interference signal within a predetermined bandwidth and using a filter characteristic that is asymmetric with respect to an actual frequency of the optical signal, and
a determining unit for determining a position of the optical signal relative to the at least one optical reference signal.

22. A method of controlling an optical signal, comprising:
superimposing at least one optical reference signal and the optical signal to obtain at least one interference signal having an actual beat frequency, and
pre-selecting one or more of the at least one interference signals using a predetermined bandwidth and a filter characteristic that is asymmetric with respect to an actual frequency of the optical signal, to determine a tuning direction when tuning the actual frequency of the optical signal.

23. A system for controlling an optical signal, comprising:
a signal source for providing the optical signal, wherein the optical signal has an actual frequency,
a reference signal source for providing at least one optical reference signal,
a superimposing unit adapted for superimposing the at least one optical reference signal with the optical signal to yield at least one interference signal having an actual beat frequency,
a preselector adapted for pre-selecting the at least one interference signal within a predetermined bandwidth and using a filter characteristic that is asymmetric with respect to an actual frequency of the optical signal, and
a determining unit for determining a tuning direction when tuning the actual frequency of the optical signal.

* * * * *

UNITED STATES PATENT AND TRADEMARK OFFICE
CERTIFICATE OF CORRECTION

PATENT NO. : 7,075,957 B2 Page 1 of 1
APPLICATION NO. : 10/713313
DATED : July 11, 2006
INVENTOR(S) : Kallmann et al.

It is certified that error appears in the above-identified patent and that said Letters Patent is hereby corrected as shown below:

In Column 8, line 26, Claim 6, delete "EN" and insert -- FN --.

In Column 9, line 7, Claim 15, delete "claim 11," and insert --claim 13, --.

Signed and Sealed this

Twenty-fourth Day of October, 2006

JON W. DUDAS
*Director of the United States Patent and Trademark Office*